United States Patent [19]

Miller

[11] Patent Number: 5,369,563

[45] Date of Patent: Nov. 29, 1994

[54] FAST TURN-OFF CIRCUIT FOR USE WITH AN AC BRIDGE CIRCUIT

[75] Inventor: Frank D. Miller, Moorpark, Calif.

[73] Assignee: Square D Company, Palatine, Ill.

[21] Appl. No.: 998,109

[22] Filed: Dec. 29, 1992

[51] Int. Cl.⁵ .......................................... H02H 7/122
[52] U.S. Cl. ...................................... 363/56; 363/17; 363/98; 363/132
[58] Field of Search ................. 363/17, 55, 56, 98, 363/132

[56] References Cited

U.S. PATENT DOCUMENTS

| | | | |
|---|---|---|---|
| 3,976,932 | 8/1976 | Collins. | |
| 4,589,051 | 5/1986 | Santurtun et al. | 363/56 |
| 4,682,278 | 7/1987 | Marquardt et al. | 363/56 |
| 4,688,165 | 8/1987 | Pruitt | 363/132 |
| 4,719,550 | 1/1988 | Powell et al. | 363/37 |
| 4,733,137 | 3/1988 | Dunham | 363/17 |
| 4,864,479 | 9/1989 | Steigerwald et al. | 363/98 |
| 4,884,186 | 11/1989 | Small | 363/132 |
| 4,916,329 | 4/1990 | Dang et al. | 307/66 |
| 4,970,620 | 11/1990 | Lehnhoff et al. | 363/56 |
| 4,989,127 | 1/1991 | Wegener | 363/98 |

Primary Examiner—Jeffrey L. Sterrett
Attorney, Agent, or Firm—Michael J. Femal; Richard J. Graefe; Larry I. Golden

[57] ABSTRACT

A power output driver circuit that converts a DC voltage into an AC voltage includes a gate driver circuit for turning on electronic switching devices. The gate driver circuit allows for a rapid turn-off of the conducting electronic switching device by having a first conduction path for the gate drive signals that turn-on the switching devices and a second conduction path that rapidly discharges stored energy in the gate/drain capacitance of the switching devices, resulting in a faster turn-off time. A transistor in the gate circuit shunts the stored charge directly to the source terminal of the switching device.

13 Claims, 4 Drawing Sheets

1

FAST TURN-OFF CIRCUIT FOR USE WITH AN AC BRIDGE CIRCUIT

DESCRIPTION

1. Technical Field

Applicant's invention relates generally to power supply devices for supplying AC input power to loads or other devices. More particularly, it relates to a system that provides for a fast turn-off circuit for power switching devices that convert DC voltages to AC voltages.

2. Related Applications

This application is related to the following, commonly assigned applications filed concurrently on Dec. 14, 1992, entitled "Average Current Mode Control Apparatus For An AC Output Amplifier" (Ser. No. 990,318, Our Docket TO-08); "An Uninterruptible Power Supply With Improved Output Regulation" (Ser. No. 990,566, Our Docket TO-09), and "Method of Phase Synchronization Between Two AC Signals" (Ser. No. 989,689, Our Docket TO-10). The contents of these applications are expressly incorporated herein by reference.

3. Background Art

The use of electronic and computer systems has expanded immensely and affects almost all ways of life. Even brief interruptions of or variations in the input power source can cause failures to these systems, resulting in lost time, data, damaged equipment, and high repair bills. To overcome these problems, UPS systems have been developed and are well known in the art. These include both on-line and off-line configurations. The simplest type, single conversion or standby, uses a battery, an inverter to convert the battery voltage to an AC output voltage, and a transfer switch that connects the AC output voltage if the source voltage is lost. The transfer time during the switching can be noticeable and can become significant in some computer applications. Double conversion or on-line types eliminate this transfer time. The AC source voltage is continuously converted by a rectifier to a DC voltage and charges a battery that is in parallel with the DC voltage. This DC voltage is converted by an inverter back to an AC output voltage. If the AC source voltage is lost, the battery supplies the DC voltage to the inverter immediately and there is no interruption in power to the Icad. Upon the return of the AC source voltage, the Icad is again supplied from the AC source without any interruption in power.

A problem commonly associated with prior art UPS systems is providing adequate protection for the solid state output devices to prevent failures due to overloads, short circuits and overheating. Once a fault condition is detected, the ability to turn-off the power switching devices rapidly becomes a large factor in the ability of the devices to survive the fault condition.

A further problem occurs with the insertion of deadtime in the gating signals to the power switching devices to prevent opposing switching devices from being on at the same time which would cause a short circuit across the DC power bus. This deadtime causes a distortion in the AC output voltage waveform that can cause instability, transients, and other problems in the load being supplied with the AC output voltage. Keeping this deadtime short will minimize the output distortion.

Applicant's invention is provided to solve these problems and provide other unique features that will become readily apparent.

SUMMARY OF THE INVENTION

Accordingly, the principal object of the present invention is to provide a means for generating signals to control conduction of electronic switching devices in a power output driver circuit that converts a DC voltage into an AC voltage.

Another object of the present invention is to provide a means for rapidly turning-off the conducting electronic switching devices in a power output driver circuit that converts a DC voltage into an AC voltage. It is a further object of the invention to provide a means of protecting the conducting electronic switching devices in the power output driver circuit under short circuit and overload conditions.

In one embodiment of the invention, these objectives are met by employing a transistor-capacitor combination in the base circuitry of the switching devices which could be power transistors, MOSFETs, IGBTs, GTOs, or other power devices that are connected across a DC bus in series connected pairs. These devices are complementary switched, meaning that only one of the pair will be on at a time. The control signals are generated by a standard high speed pulse width modulated (PWM) converter that is not an object of the present invention. The output of the PWM is fed to a primary winding of a quad-secondary winding transformer which provides the correct polarity gating signals and therefore sequence of operation for each of the series connected pairs of power devices. As the output gate signal from the secondary windings increases, the threshold voltage of the power device will be reached and it will turn on. At turn off, the base transistor functions as a helper and will increase the turn off current removed from the base of the power device, resulting in a faster turn-off time.

Other features and advantages of the invention will be apparent from the following specification taken in conjunction with the accompanying drawings in which there is shown a preferred embodiment of the invention. Reference is made to the claims for interpreting the full scope of the invention which is not necessarily represented by such embodiment.

DETAILED DESCRIPTION

Although this invention is susceptible to embodiments of many different forms, a preferred embodiment will be described and illustrated in detail herein. The present disclosure exemplifies the principles of the invention and is not to be considered a limit to the broader aspects of the invention to the particular embodiment as described.

Figure 1:
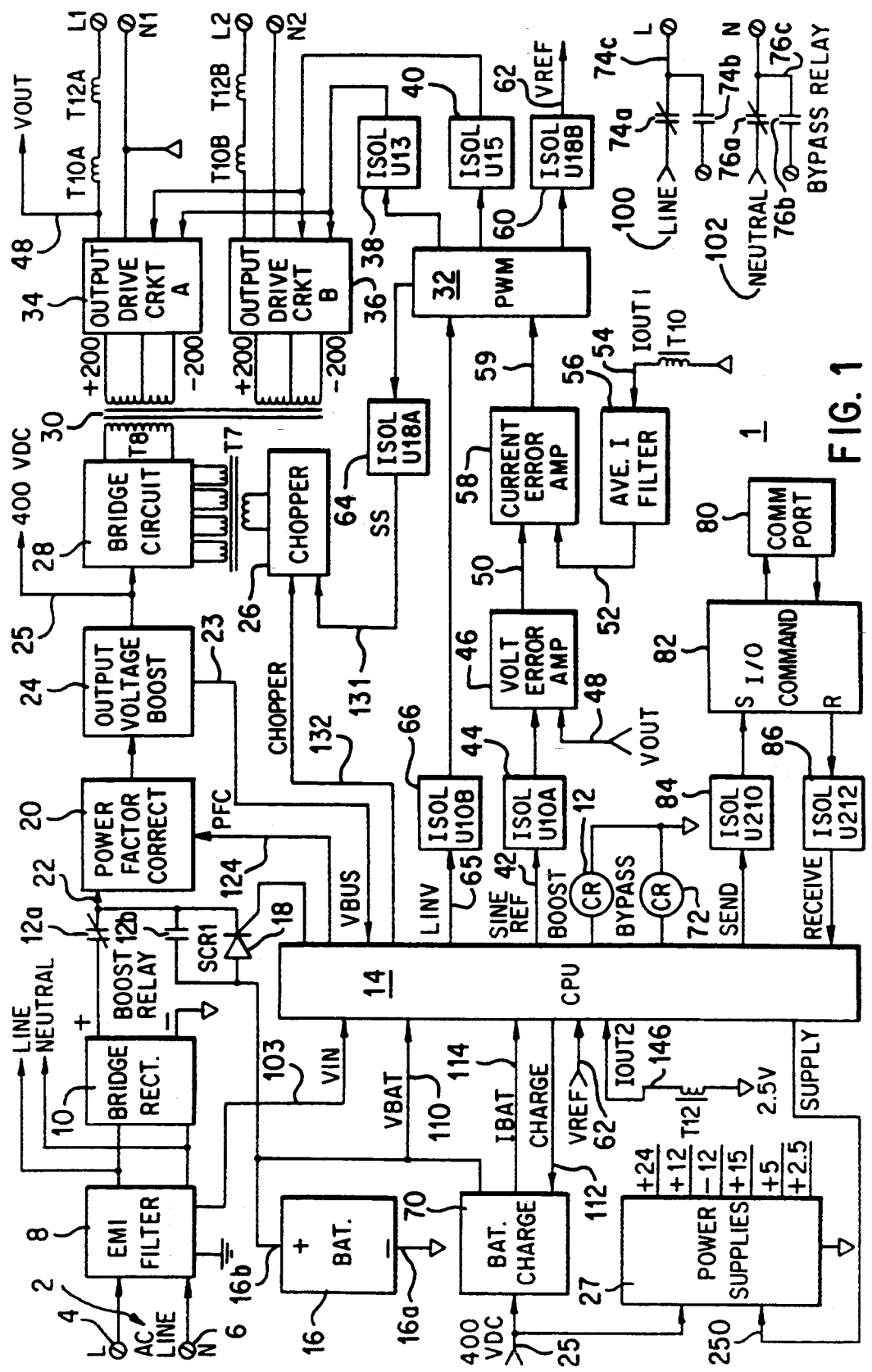
FIG. 1 is a detailed schematic block diagram of an uninterruptible power supply (UPS) system utilizing the present invention.

The preferred embodiment can be best understood by referring to FIG. 1 which illustrates a detailed schematic block diagram of a uninterruptible power supply (UPS) system 1 that utilizes the present invention. Incoming AC input voltage 2 is connected to input terminals 4,6 which are coupled to an EMI filter 8 to reduce the effects of transients that might be present from the AC source or transmission lines. The Line and Neutral lines from the filter 8 are converted by bridge rectifier 10 to a +DC and −DC voltage. The +DC voltage is connected to a normally-closed contact 12a of boost relay 12. The −DC voltage is referenced to system ground as is the −terminal 16a of battery 16, for which the preferred embodiment is nominally 48 VDC but could be other voltages as well. The +terminal 16b of battery 12 is coupled to a normally open contact 12b of boost relay 12 and to the anode of SCR 18. Boost relay 12 is controlled by CPU 14 and provides the transfer means for supplying the operating power for the remainder of the UPS system 1 from either the battery 12 or the AC input voltage 2. Boost relay 12 also shorts out SCR 18 to eliminate the power losses in it when the battery 12 is the source of the operating power.

The CPU monitors the AC input voltage 2 as represented by VIN and the battery 16 voltage VBAT. In the normal mode, wherein the AC input voltage 2 and therefore, VIN, is within established limits or tolerances, the boost relay 12 is deenergized and power factor correction control circuit 20 is supplied at input 22 with the +DC voltage from bridge rectifier 10 through contact 12a. In the battery backup mode, wherein VIN is outside these limits, CPU 14 supplies gate current to turn on SCR 18 and energizes the boost relay 12 after a short time delay. This is to prevent power losses in SCR 18 during the battery backup mode and also prevents the UPS device 1 from backfeeding into the AC line source 2. The battery 16 then supplies the power at input 22 for the power factor correction control circuit 20 through contact 12b. CPU 14 continues to monitor the AC input voltage and will transfer back to the normal mode when VIN returns to its allowable tolerances and when phase lock between the AC input source 2 and the AC power output L1, N1. The power factor correction control 20 in conjunction with an output voltage boost circuit 24 optimizes the selected voltage at input 22 to create a 400 VDC bus 25 whether input 22 is supplied from the AC input line 2 or the battery 16. The 400 VDC bus 25, in addition to supplying power for the output circuits of the UPS device 1, also is the source of power for the various power supplies 27 that power the circuitry in UPS device 1. CPU 14 provides the control signal PFC to enable the power factor correction control circuit 20.

An inverter comprised of chopper 26 and bridge driver circuit 28 converts the 400 VDC bus 25 to an intermediate AC voltage 30. The chopper 26 is also controlled by CPU 14. Transformer T8 isolates and couples the intermediate AC voltage 30 to the output inverter circuits which rectifies the secondary AC voltage to produce a +DC and −DC voltage which is then reconverted back to AC. The output inverter circuits consist of a pulse width modulator 32 and isolated output drive circuit A 34 and drive circuit B 36. Pulse width modulator 32 provides the gate drive signals to output drive circuit A 34 and drive circuit B 36 through isolator 38 and 40 respectively. The AC output of output drive circuit A 34 is connected to output terminals L1 and N1 and the AC output of output drive circuit B 36 is connected to output terminals L2 and N2. These terminals are used for connecting the load to the UPS system 1 and provide separate and isolated AC outputs that could be connected in series to provide a higher voltage output. If L1-N1 and L2-N2 are 120 VAC, the combination would result in 240 VAC, for instance.

The inverter consists of a switch mode power amplifier and has an inner feedback control loop within the overall output voltage control loop to provide improved output voltage and frequency stability. CPU 14 produces a sine reference signal 42 that is used to provide synchronization of the output AC voltage when a transfer is made between the AC Line 2 and the battery 16 as the source of power for the UPS system 1. Sine reference signal 42 passes through isolator 44 to voltage error amplifier 46 where it is compared with an attenuated VOUT signal 48 which is representative of the actual AC output L1. The voltage error amplifier 46 produces an error output signal 50 that is proportional to the difference between the desired output and the actual output at L1-N1 and L2-N2. In prior art systems, output signal 50 would be feed to the pulse width modulator 32 to complete the outer control loop. Instead of this, an inner control loop uses output signal 50 and current feedback signal 52 to effectively produce a voltage controlled current source. Current transformer T10 produces a signal IOUT1 54 that is proportional to the total current drawn by the loads connected to terminals L1-N1 and L2-N2. IOUT1 54 is coupled to an average current filter 56 to produce current feedback signal 52 which is feed to a current error amplifier 56. An error in output voltage as indicated by error output signal 50 can be interpreted by the inner loop as a change in demand for output current. The current error amplifier 56 responds through output 59 which is a current error signal that controls the duty cycle of pulse width modulator 32.

CPU 14 samples the output voltage with respect to frequency and magnitude through isolator 60 which provides signal line VREF 62. VREF 62 is compared with VIN in CPU 14 as part of a phase locked loop function to produce the sine reference signal 42 to regulate the output frequency and phase angle of the AC outputs. CPU 14 also functions to shutdown PWM 32 and thus the AC outputs L1-N1 and L2-N2 and UPS system 1 when the battery 16 has discharged to a level that no longer can sustain the AC output voltage within established limits. This is accomplished by signal LINV 65 through isolator 66 which clamps the outputs of PWM 32. PWM 32 also provides a shutdown signal SS 131 to chopper circuit 26 through isolator 64. CPU 14 also samples the output current through current transformer T12 which produces signal line IOUT2.

Figure 2:
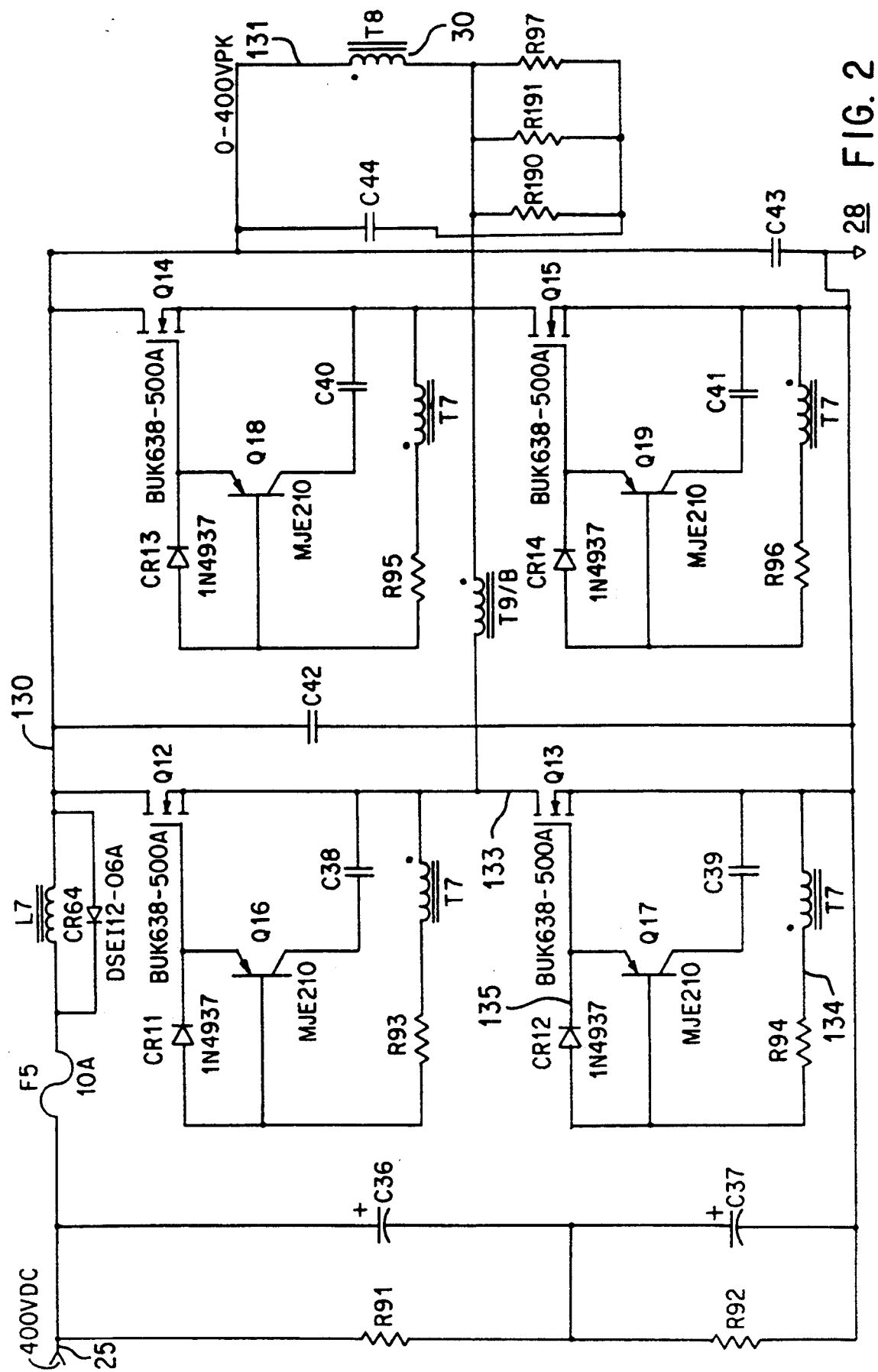
FIG. 2 is a circuit diagram of the chopper circuit of the DC-AC power inverter as depicted in FIG. 1.
Figure 3:
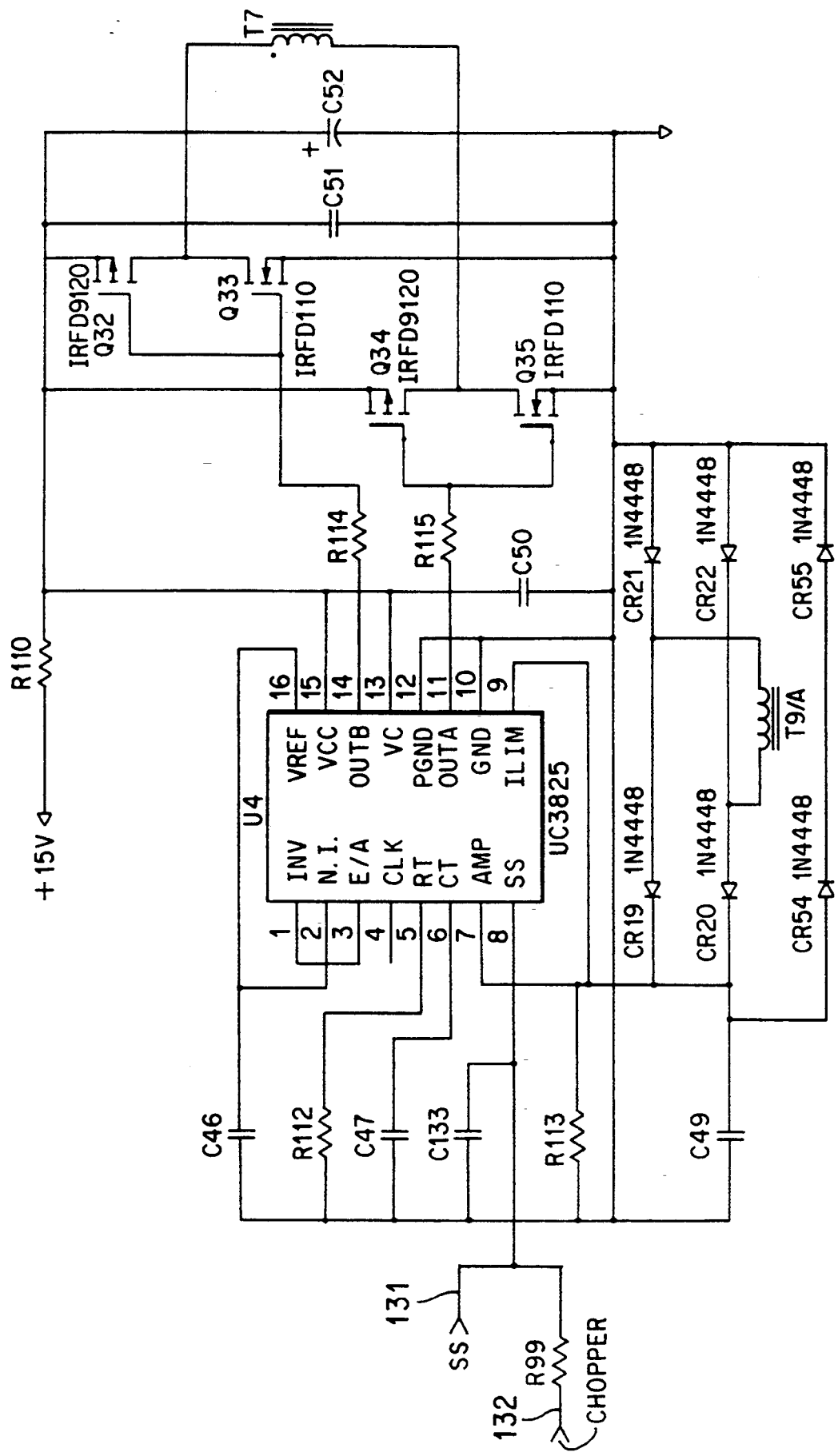
FIG. 3 is a circuit diagram of the bridge circuit as depicted in FIG. 1 and constructed according to the present invention.

FIGS. 2 and 3 detail the chopper circuit 26 and the bridge circuit 28 which combine to create a DC to AC inverter function as depicted in FIG. 1 and constructed according to the present invention. A conventional high speed PWM controller IC chip U4, such as an Unitrode type UC3825, provides the control means for the driver circuits. PWM controller U4 operates at a switching frequency of approximately 100 KHz and is configured to limit peak output current. The totem pole output, pins 11 and 14, is boosted by power MOSFETs Q32-Q35 to provide sufficient power to switch opposite legs of the primary winding of transformer T7. The quad secondary windings of T7 couple the output of the chopper circuit 26 to bridge circuit 28 consisting of four identical driver circuits to provide full four quadrant conduction.

The 400 VDC bus 25 as stored in the series combination of capacitors C36–37 is coupled through fuse F5 to one side of input inductor L7. Node 130 connects the other side of L7 to the drain terminal of MOS transistors Q12 and Q14. Node 131 connects one side of the primary of transformer T8 to the drain terminal of MOS transistors Q13 and Q15 and to the source terminal of MOS transistors Q12 and Q14. The other side of the primary of T8 is coupled to one primary lead of current transformer T9. The other primary lead of T9 is connected to junction 133 of the source terminal of MOS transistor Q12 and the drain terminal of MOS transistor Q13. The source terminal of MOS transistors Q13 and Q15 is connected to system ground. Gate drive signals from the chopper circuit 26 as coupled through the quad secondaries of T7 cause conduction of transistors Q16–Q19 to provide gate drive for Q12–Q15 respectively.

Figure 4A:
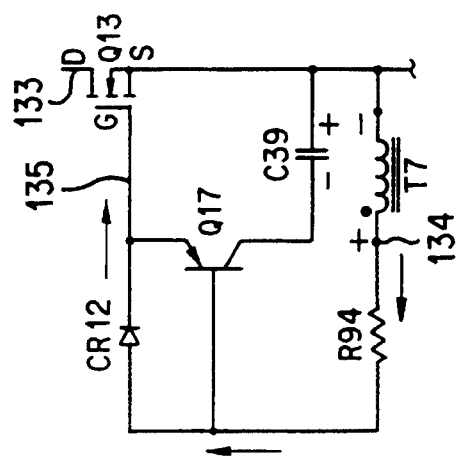
FIGS. 4a and 4b are circuit diagrams of the base drive circuit of FIG. 3 showing current flow during the turn on mode and the turn off mode respectively.

When transformer T7 produces a positive voltage through the secondary winding at node 134, as shown in FIG. 4a, the voltage across resistor R94 increases exponentially and is coupled through diode CR12 to the gate 135 of FET transistor Q13. Q13 could also be an isolate gate bipolar transistor. When the turn on gate to source threshold voltage of Q13 is reached, a small voltage plateau is reached until the effective gate to drain capacitance is discharged. At this time, Q13 turns on and the drain voltage is essentially near the source voltage. The voltage at the gate 135 continues to rise exponentially towards +15 VDC, the supply voltage of U4. The charging of the gate to source and gate to drain capacitances are a function of the actual effective value of these capacitances and the current available to charge these capacitances. The current available to accomplish this is equal to the transformer T7 voltage minus the diode CR12 voltage, minus the gate to source voltage of Q13, all divided by the resistor R94.

Figure 4B:
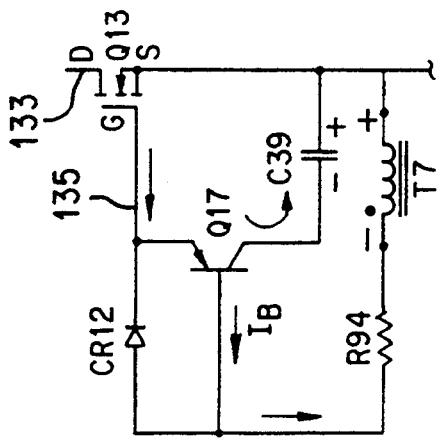

When transformer T7 couples a negative voltage through the secondary winding at node 134, as shown in FIG. 4b, transistor Q13 will turn-off faster than it turned on due to transistor Q17 which increases the amount of current extracted from Q13 at turn-off. For a capacitor, capacitance is equal to current times time divided by voltage. Therefore, if more current can be extracted from the capacitance during turn-off than during turn-on, and given that the voltage is equal, it follows that the time for discharge will be less. Accordingly, when node 134 goes negative, the current taken out of gate 135 will be the current through resistor R94 times the BETA of transistor Q17. Capacitor C39 serves as a negative supply voltage for the collector of Q17 and is recharged when transformer T7 secondary approaches −15 VDC. The remaining driver circuits for Q12, Q14, and Q15 function in the same manner.

Figure 5A:
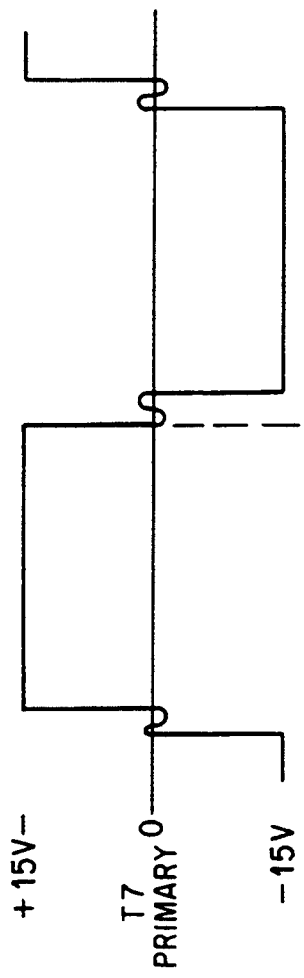
FIGS. 5a–c are voltage waveforms of various signals in the base drive circuitry of FIGS. 3a and 3b.
Figure 5B:
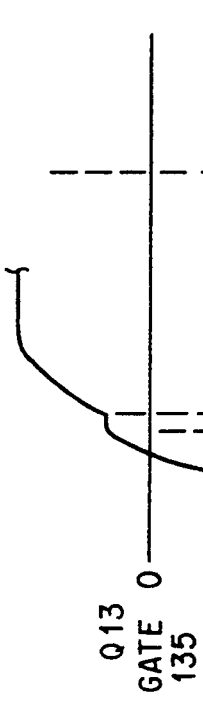
Figure 5C:

FIGS. 5a–c provide waveforms that illustrate the principles outlined above. The chopper circuit 26 generates a square wave pulse as shown in FIG. 5a that is coupled to the transformer T7. At time T0 as depicted in FIG. 5b, the voltage rises from the negative rail towards the positive rail of the U4 supply voltage. At time T1, the gate voltage reaches the threshold voltage whereby Q13 starts to turn on. At will remain at this level or plateau until Q13 turns completely on as explained above. The time for Q13 to completely turn on then is represented by the interval T0–T2. During turn off at time T3, when the output from the chopper circuit 26 falls from the positive rail towards the negative rail of the U4 supply voltage, there is minimal time delay for Q13 to turn off. The effective turn-off time has been decreased by the time interval T0–T2, the main objective of the present invention. The time interval T3–T4 represents the time to recharge capacitor C39 which provides the collector supply voltage of Q17.

Full four quadrant conduction through T8 is achieved by alternate conduction of transistor pair Q12 and Q15 for one polarity and Q13 and Q14 for the opposite polarity. When one transistor pair is conducting, the other is not. When Q12 and Q15 are conducting, +400 VDC is present at node 133 while node 131 is almost at 0 volts. When Q13 and Q14 are conducting, +400 VDC is present at node 131 and node 133 is then at 0 volts. The chopper circuit 26 operates at a duty cycle close to 50%. Current flow through T9 is coupled back to provide current feedback to the PWM controller U4 at pins 7 and 9. This current feedback signal will cause the chopper 26 to shutdown if there is a severe overload, i.e., a high demand in current. The fast turn off circuitry will allow for a shutdown of the output switching devices Q12–Q15 without the delay T0–T2, resulting in a higher likelihood of survival of the switching devices.

Thus, the 400 VDC bus is pulse width modulated through transformer T8 to provide on the dual, center-tapped secondaries of T8 sufficient power to provide the output voltage and current at terminals L1–N1 and L2–N2. SS Signal 131 provides a soft start feature to prevent high inrush currents, controls the maximum duty cycle of U4, and provides a means of shutting down the inverter, and thus the UPS device 1.

While the specific embodiments have been illustrated and described, numerous modifications are possible without departing from the scope or spirit of the invention. Modifications of the embodiment can be made as desired by varying the values of the illustrated components or using alternative and equivalent integrated circuit devices to effect the same procedures.

I claim:

1. An improved gate drive circuit for controlling conduction of a power switching device of an AC bridge circuit having at least one phase and for decreasing turn-off time of said power switching device, said power switching device having a gate terminal, a first terminal connected to a power source, and an output terminal said improved gate drive circuit comprising;
    a) means for coupling a gate drive signal generated by a PWM control circuit to said gate drive circuit for controlling conduction of said power switching device;
    b) means for shunting said gate terminal to said first terminal of said power switching device when said gate drive signal is removed, said shunting means including a transistor having an emitter connected to said gate terminal and a collector connected to a capacitor, said capacitor also connected to said first terminal of said power switching device:
    c) wherein said power switching device has an effective gate/drain capacitance that is charged by said gate drive signal during turn-on:
    d) wherein removal of said gate drive signal causes said transistor to conduct: and
    e) wherein said effective gate/drain capacitance is discharged by said gate drive signal during turn-off following a conduction path from said gate terminal through said conducting transistor and said capacitor connected to said first terminal of said power switching device, decreasing said turn-off time of said power switching device.

2. The improved gate drive circuit of claim 1 wherein said coupling means of said gate drive signal consists of a transformer having a primary winding coupled to said PWM control circuit and a secondary winding having a first end coupled to said first terminal and a second end coupled to said gate terminal through a resistor and a rectifier connected in series.

3. The improved gate drive circuit of claim 2 wherein said transistor has a gain of Beta.

4. The improved gate drive circuit of claim 3 wherein said transistor includes a base connected to a node between said series connected resistor and rectifier.

5. The improved gate drive circuit of claim 4 wherein said effective gate/drain capacitance is charged by said gate drive signal during turn-on which follows a conduction path from said second end of said secondary winding to said series connected resistor and rectifier to said gate terminal, and through said power switching device back to said first end of said secondary winding, and wherein said gate/drain capacitance is charged by a rate substantially determined by said resistor.

6. The improved gate drive circuit of claim 5 wherein said gate drive signal coupled during turn-off of said power switching device follows a conduction path from said first end of said secondary winding to said power switching device, from said gate terminal to said transistor, to said resistor and back to said second end of said secondary winding, causing said transistor to conduct.

7. The improved gate drive circuit of claim 6 wherein said effective gate/drain capacitance is discharged by said gate drive signal during turn-off at a rate equal to said charge rate multiplied by said Beta of said transistor.

8. The improved gate drive circuit of claim 1 wherein said power switching device is a field effect transistor (FET).

9. The improved gate drive circuit of claim 1 wherein said gate drive circuit includes means for sensing output current of said AC bridge circuit, said sensing means for shutting down said PWM control circuit if said output current is above a predetermined level.

10. An improved gate drive circuit for controlling conduction of a power switching device of an AC bridge circuit having at least one phase and for decreasing turn-off time of said power switching device, said power switching device having a gate terminal, a first terminal connected to a power source, and an output terminal said improved gate drive circuit comprising:

a) a first conduction path including a resistor for coupling a gate drive signal generated by a PWM control circuit to said gate drive circuit for controlling conduction of said power switching device, said conduction path for charging an effective gate/drain capacitance inherent in said power switching device, at a rate determined by said resistor, and for controlling turn-on time of said power switching device;

b) a second conduction path for discharging said effective gate/drain capacitance when said gate drive signal is removed, said second conduction path containing a transistor with a gain, and said power switching device turning-off when said gate/drain capacitance is discharged;

c) wherein said second conduction path is from said gate terminal of said power switching device to said transistor and through a capacitor connected to a collector lead of said transistor back to said first terminal of said .Dower switching device; and d) wherein said discharging of said gate/drain capacitance is discharged at a rate equal to the charge rate times the gain of said transistor, said discharge rate substantially greater than said charge rate, and said turn-off time substantially less than said turn-on time.

11. The improved gate drive circuit of claim 10 wherein said power switching device is a field effect transistor (FET).

12. The improved gate drive circuit of claim 10 wherein said first conduction path consists of a transformer having a primary winding coupled to said PWM control circuit and a secondary winding having a first end coupled to said first terminal and a second end coupled to said gate terminal of said power switching device through said resistor and a rectifier connected in series.

13. The improved gate drive circuit of claim 10 wherein said gate drive circuit includes means for sensing output current of said AC bridge circuit, said sensing means for shutting down said PWM control circuit if said output current is above a predetermined level.

* * * * *